United States Patent
Kim

[11] Patent Number: 5,889,290
[45] Date of Patent: Mar. 30, 1999

[54] THIN FILM TRANSISTOR AND MANUFACTURING METHOD THEREOF

[75] Inventor: Woong Kwon Kim, Anyang-Si, Rep. of Korea

[73] Assignee: LG Electronics, Inc., Seoul, Rep. of Korea

[21] Appl. No.: 896,530

[22] Filed: Jul. 18, 1997

Related U.S. Application Data

[63] Continuation of Ser. No. 620,315, Mar. 22, 1996, abandoned.

[30]     Foreign Application Priority Data

Nov. 22, 1995 [KR] Rep. of Korea ................. 1995/43023

[51] Int. Cl.$^6$ .............................. H01L 29/78; H01L 27/12
[52] U.S. Cl. .................................. 257/57; 257/59; 257/66
[58] Field of Search ................. 257/57, 60, 330, 257/347, 59, 58, 61, 66

[56]     References Cited

U.S. PATENT DOCUMENTS

| | | | |
|---|---|---|---|
| 4,778,773 | 10/1988 | Sukegawa | 257/57 |
| 4,864,376 | 9/1989 | Aoki | 257/59 |
| 4,990,981 | 2/1991 | Tanaka et al. | 257/60 |
| 5,021,850 | 6/1991 | Tanaka et al. | 257/59 |
| 5,084,905 | 1/1992 | Sasaki et al. | 257/347 |
| 5,109,260 | 4/1992 | Tanaka et al. | 257/66 |
| 5,198,694 | 3/1993 | Kwasnick et al. | 257/57 |
| 5,270,567 | 12/1993 | Mori et al. | 257/66 |
| 5,272,360 | 12/1993 | Todoroki et al. | 257/60 |
| 5,294,811 | 3/1994 | Abyama et al. | 257/347 |
| 5,473,168 | 12/1995 | Kawai et al. | 257/61 |

FOREIGN PATENT DOCUMENTS

| | | | |
|---|---|---|---|
| 60-260155 | 12/1985 | Japan | 257/66 |
| 361032471 | 2/1986 | Japan | 257/57 |
| 402201966 | 8/1990 | Japan | 257/57 |
| 405226652 | 9/1993 | Japan | 257/57 |
| 5-283693 | 10/1993 | Japan | 257/66 |

*Primary Examiner*—Donald Monin

[57]     ABSTRACT

A thin film transistor and a simplified manufacturing method thereof, which results in enhanced charge mobility. The thin film transistor includes: a substrate; a gate electrode on said substrate; a gate insulating layer on said substrate and said gate electrode; a doped semiconductor layer, on the gate insulating layer, which is split into a first and second portion; a first metal layer on the first doped semiconductor portion; a second metal layer on the second doped semiconductor portion; and a top semiconductor layer in a gap formed by the first and second metal layer: the first doped semiconductor portion, the second doped semiconductor portion, and the insulating layer.

12 Claims, 7 Drawing Sheets

THIN FILM TRANSISTOR AND MANUFACTURING METHOD THEREOF

This application is a continuation, of application Ser. No. 08/620,315 filed on Mar. 22, 1996, now abandoned.

BACKGROUND OF THE INVENTION

The present invention relates to a thin film transistor, and more particularly, to a thin film transistor and manufacturing method which can increase charge mobility by simplifying the manufacturing process and shortening the current path between the source and the drain.

In general, a thin film transistor is widely used for liquid crystal display devices or static random access memory (SRAM) devices.

Such a conventional thin film transistor will now be described with reference to the accompanying drawings.

FIGS. 1A through 1D are cross-sectional views showing the prior art process of forming a thin film transistor according to a first technique, and FIGS. 2A through 2D are cross-sectional views showing the process of forming a thin film transistor according to a second prior art technique.

According to the first prior art technique of manufacturing a thin film transistor, as shown in FIG. 1A, a gate electrode 2 is formed on a glass substrate 1. A gate insulating layer 3, an amorphous silicon (a-Si) semiconductor layer 4 and an n$^+$-amorphous silicon (n$^+$-a-Si) semiconductor layer 5 are sequentially deposited over a gate electrode 2 on a glass substrate 1.

As shown in FIG. 1B, outer portions of the amorphous silicon semiconductor layer 4 and the n$^+$-amorphous silicon semiconductor layer 5 are selectively removed, such that layers 4 and 5 remain only in an active region.

As shown in FIG. 1C, after a metal layer is wholly deposited, the metal layer is patterned by a photolithography process to form a source electrode 6a and a drain electrode 6b.

As shown in FIG. 1D, the n$^+$-amorphous silicon semiconductor layer 5 is selectively etched using source electrode 6a and drain electrode 6b as masks to expose a channel region 8, and thereby complete the thin film transistor.

FIG. 1F is a simplified depiction of the sequence of layers in FIGS. 1C–1D. The sequence 60 is as follows: an amorphous silicon (a-Si) layer 66; an n-type amorphous silicon (n$^+$-a-Si) layer 64 on the a-Si layer 66; and a metal layer 62 on the n$^+$-a-Si layer 64. This sequence 60 of layers solved a problem in the art.

The problem solved by using the sequence 60 of layers in FIG. 1F is represented in FIG. 1E, again, by a simplified depiction of layers 50. The sequence of layers 50 was as follows: an amorphous silicon (a-Si) layer 56; and a metal layer 52 on the a-Si layer 56. The problem with the sequence of layers 50 was that a Schottky barrier 54 formed between the metal layer 52 and the a-Si layer 56, which greatly reduced the charge mobility in the transistor formed from this sequence of layers. Again, the prior art solved this problem by inserting an n$^+$-a-Si layer 64 between the metal layer 62 and the a-Si layer 66 as in FIG. 1F. In effect, the n$^+$-a-Si layer 64 acts as an ohmic contact layer.

However, in the manufacturing method of the thus-formed thin film transistor, because etching selectivities of the n$^+$-amorphous silicon semiconductor layer 5 and the amorphous silicon semiconductor layer 4 formed thereunder are small, it is difficult to etch precisely only the n$^+$-amorphous silicon semiconductor layer 5 using source electrode 6a and drain electrode 6b as masks. Thus, the n$^+$-amorphous silicon semiconductor layer 5 is likely to be left over, and the n$^+$-amorphous silicon semiconductor layer 5 and the amorphous silicon semiconductor layer 4 may be over-etched, which lowers the reliability of the device and increases the deterioration probability.

In other words, the prior art technique of FIG.s 1A–1D and 1F produced an active layer, i.e., the a-Si layer, whose thickness varied by ±10%. If this first technique were used to manufacture thin film transistors (TFTs) in a liquid crystal display (LCD), the quality of the LCD in which they were used was diminished. FIG. 1G depicts a plot of drain-source ($I_{DS}$) currents for two transistors, both of which were manufactured by the first prior art technique and which exhibit variations in their respective active layer thicknesses. FIG. 1G shows the effect of the variations in active layer thickness. In particular, the drain source current 67 for transistor No. 1 is significantly different than the drain source current 68 for transistor No. 2. The result of these variations is that images on the LCD appear blurred. Because blurred images are unacceptable, a ±10% variation in active layer thicknesses is unacceptable, i.e., too many TFT arrays must be discarded due to the presence of these defects.

A second prior art manufacturing technique for solving such problems is shown in FIGS. 2A through 2D. In the second prior art technique of manufacturing a conventional thin film transistor, as shown in FIG. 2A, a gate electrode 2 is formed on a glass substrate 1 and a gate insulating layer 3 is formed on the glass substrate 1 and the gate electrode 2. Then, an amorphous silicon (a-Si) semiconductor layer 4 is deposited on the gate insulating layer 3 to form an active layer.

As shown in FIG. 2B, first an insulating layer (a silicon nitride layer) is wholly deposited, and then an unnecessary portion is removed by a photolithography process to form an etch stopper layer 7 on the portion of the active layer (a-Si) directly above the gate electrode 2.

As shown in FIG. 2C, an n$^+$-amorphous silicon (n$^+$-a-Si) semiconductor layer 5 is deposited on the amorphous silicon semiconductor layer 4 and the etch stopper layer 7.

As shown in FIG. 2D, first a metal layer is wholly deposited and then the metal layer is patterned in a photolithography process to form a source electrode 6a and a drain electrode 6b. The n$^+$-amorphous silicon semiconductor layer 5 is selectively etched using the source electrode 6a and the drain electrode 6b as masks to expose a channel region 8.

In the second prior art thin film transistor manufacturing technique acceptable active layer thickness variation is accomplished via etching the n$^+$-amorphous silicon semiconductor layer 5 in the channel region 8 by forming an etch stopper layer. However, because the etch stopper layer is separately formed, the overall manufacturing process becomes complex, i.e., more costly because more steps are involved.

Also, according to the first and second prior art thin film transistor manufacturing techniques, there is a limit on the degree to which the charge mobility can be improved due to the long current path (9 FIG. 3) between the source and the drain, i.e., due to the size of the channel region 8.

FIG. 3 shows the current path 9 according to the, prior art thin film transistor, in which the current path between the source and the drain is formed in the interface between a gate insulating layer 3 and an amorphous silicon semiconductor layer 4. The thicker the amorphous silicon semiconductor (a-Si) layer 4, the longer the current path 9. Also, a thick semiconductor layer 4 may result in an off-set phenomenon.

SUMMARY OF THE INVENTION

To solve the problems of the prior art, it is an object of the present invention to provide a thin film transistor and manufacturing method thereof, which can simplify the process and enhance charge mobility.

To accomplish the above object, there is provided a thin film transistor according to the present invention comprising: a substrate; a gate electrode on said substrate; a gate insulating layer on said substrate and said gate electrode; a doped semiconductor layer, on the gate insulating layer, which is split into a first and second portion; a first metal layer on the first doped semiconductor portion; a second metal layer on the second doped semiconductor portion; and a top semiconductor layer in a gap formed by the first and second metal layer: the first doped semiconductor portion, the second doped semiconductor portion, and the insulating layer.

To accomplish the above object, there is also provided a method of manufacturing a thin film transistor comprising the steps of: a) providing a substrate; b) forming a gate electrode on said substrate; c) forming a gate insulating layer on said substrate and said gate electrode; d) forming a doped semiconductor layer on the gate insulating layer; e) forming a metal layer on the doped semiconductor layer; f) removing a portion of each of the doped semiconductor layer and the metal layer to form a gap; and g) forming a top semiconductor layer into the gap.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE PREFERRED EMBODIMENTS

Figure 1A:
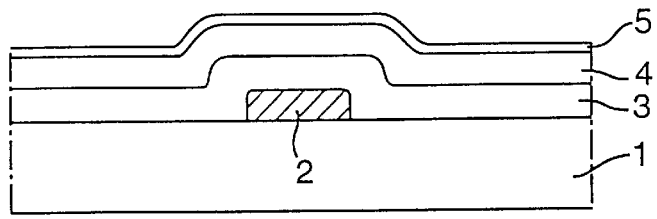
FIGS. 1A through 1D and 1F are cross-sectional views of a thin film transistor manufactured according to a first prior art technique.
Figure 1B:
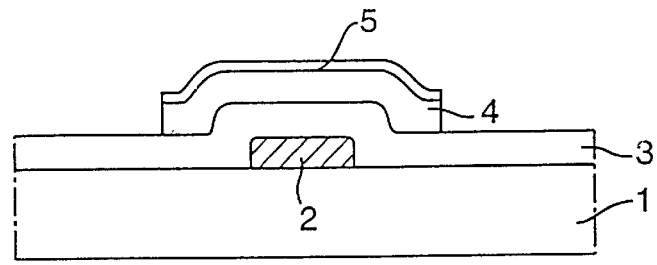
Figure 1C:
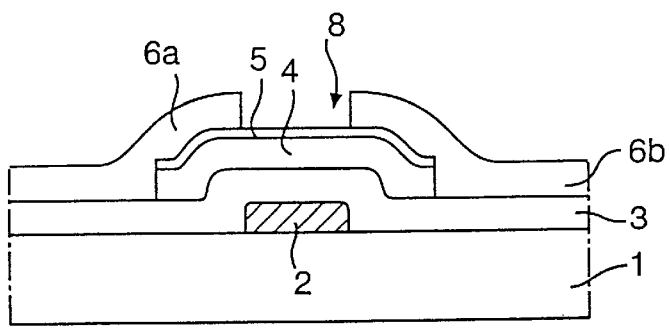
Figure 1D:
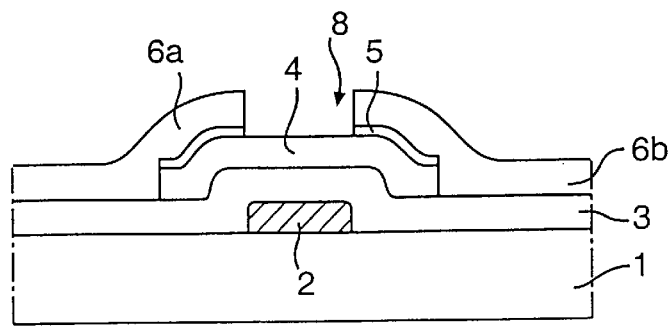
Figure 1E:
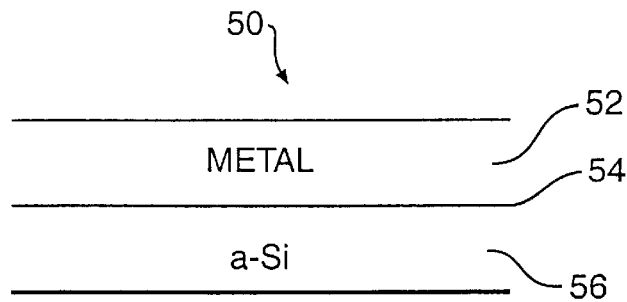
FIG. 1E is a cross-sectional view of a layer sequence in the prior art which suffers a problem.
Figure 1F:
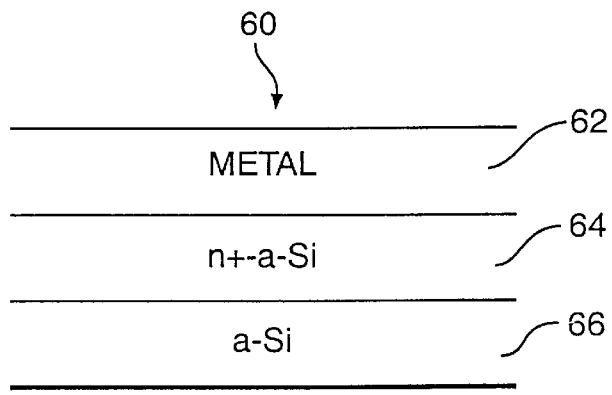
Figure 1G:
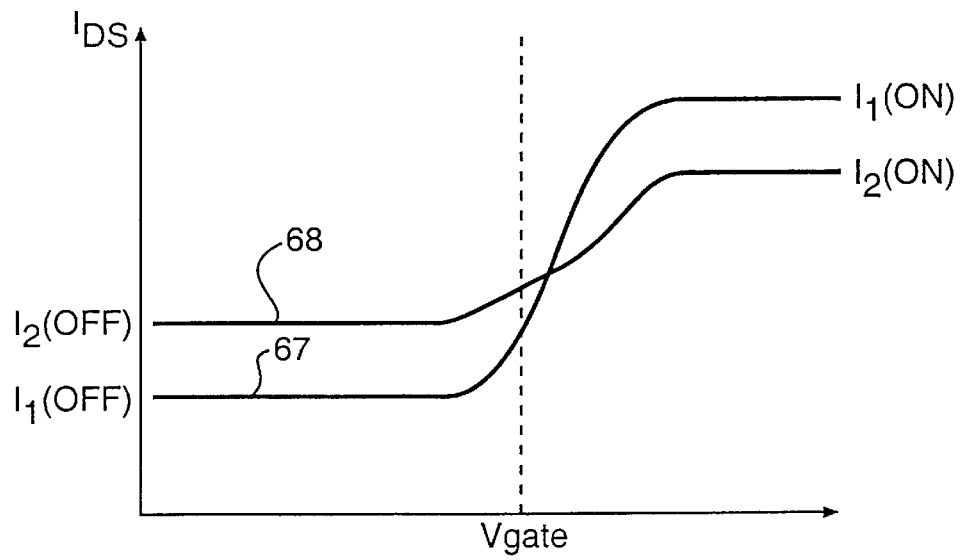
FIG. 1G a plot of drain-source currents for two transistors exhibiting variation in active layer thicknesses.
Figure 2A:
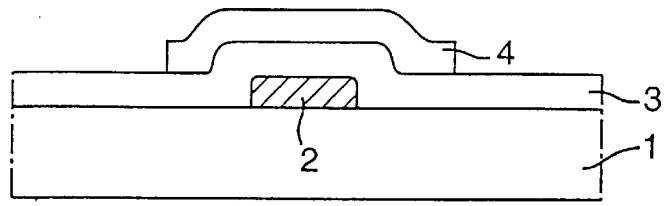
FIGS. 2A through 2D are cross-sectional views of a thin film transistor manufactured according to a second prior art technique.
Figure 2B:
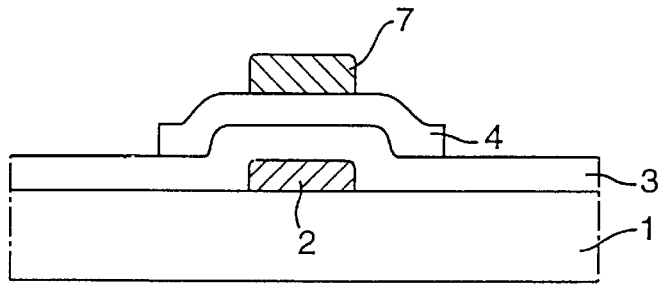
Figure 2C:
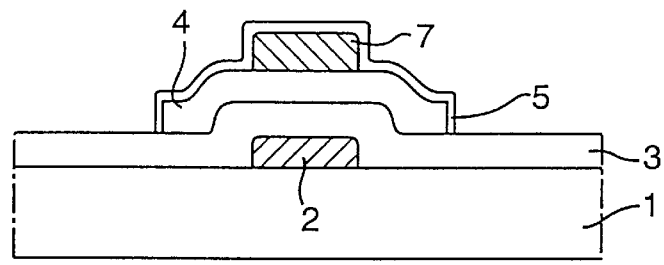
Figure 2D:
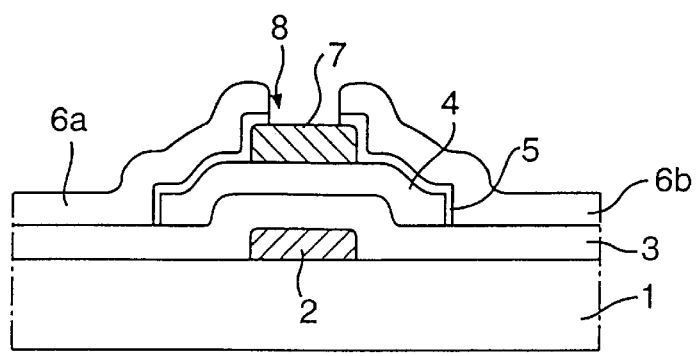
Figure 3:
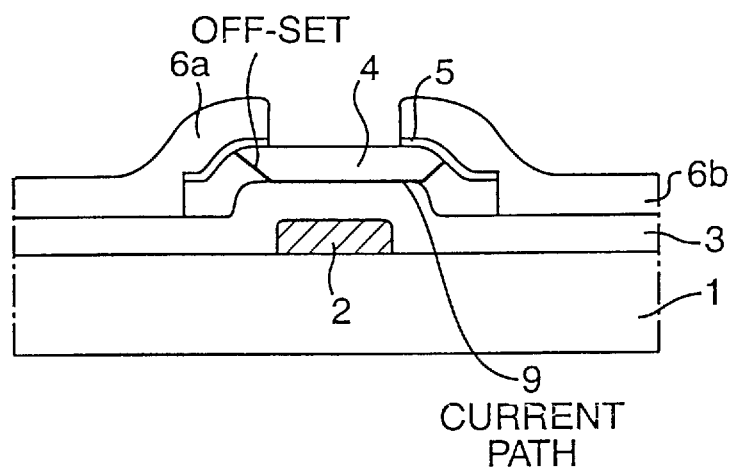
FIG. 3 shows the current path of the prior art thin film transistor.
Figure 4A:
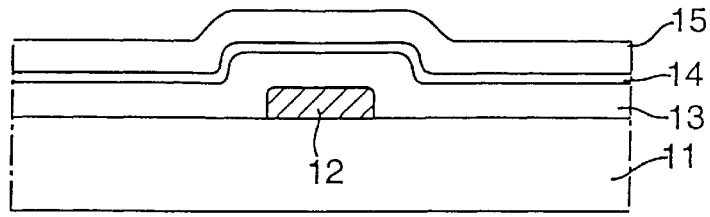
FIGS. 4A through 4C are cross-sectional views of a thin film transistor according to the first embodiment of the present invention.
Figure 4B:
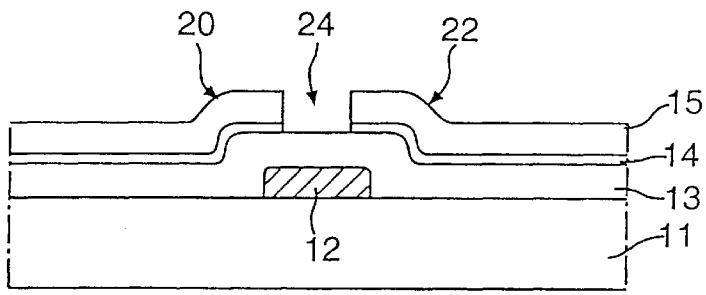
Figure 4C:
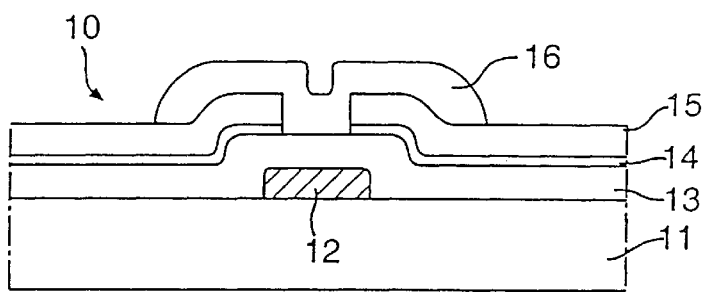

FIGS. 4A through 4C show the method of manufacturing a thin film transistor (10 FIG. 4c) according to the first embodiment of the present invention. In FIG. 4A, a gate electrode 12 is formed on a glass substrate 11. A gate insulating layer 13 such as $SiN_X$, an $n^+$-amorphous silicon semiconductor ($n^+$-a-Si) layer 14 and a metal layer 15, such as Cr, are sequentially deposited over a glass substrate 11 and the gate electrode 12.

As shown in FIG. 4B, a source region 20 and a drain region 22 are defined. The metal layer 15 and the $n^+$-amorphous silicon semiconductor layer 14, in a gap 24 corresponding to a channel region of a transistor, are selectively removed using the gate insulating layer 13 as an etch stopper.

In other words, because the gate insulating layer 13 is formed under the metal layer 15 and $n^+$-amorphous silicon ($n^+$-a-Si) semiconductor layer 14, the $n^+$-amorphous silicon semiconductor layer 14 is precisely etched using the gate insulating layer 13 as an etch stopper.

As shown in FIG. 4C, an amorphous silicon semiconductor (a-Si) layer 16 is deposited at least in the gap 24 formed by the gate insulating layer 13, the split n+-amorphous silicon semiconductor layer 14, and the split metal layer 15. Preferably, the a-Si layer 16 extends outside the gap 24 but over only the active region of the transistor 10, to form an active layer.

Figure 4D:
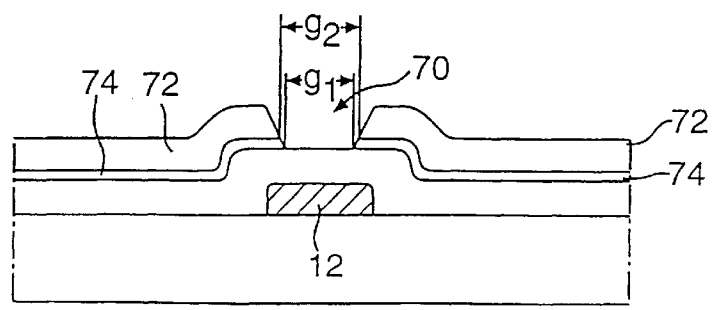
FIG. 4D depicts an alternative configuration of the embodiment of FIG. 4C.

As an alternative to the configuration of the gap 24 shown in FIG. 4B, FIG. 4D shows a gap 70 having sloping sides. In particular, a gap $g_2$, measured where the distance between the portions of the metal layer 72 is most narrow, is greater than the gap $g_1$, measured where the distance between the portion of the $n^+$-a-si layers is most narrow.

The method of manufacturing a thin film transistor (26 FIG. 5e) according to the second embodiment of the present invention is shown in FIGS. 5A through 5E.

Figure 5A:
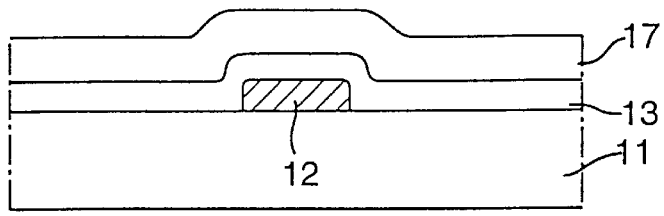
FIGS. 5A through 5E are cross-sectional views of a thin film transistor according to the second embodiment of the present invention.

As shown in FIG. 5A, a gate electrode 12 is formed on a glass substrate 11. A gate insulating layer 13 such as $SiN_X$ and a photoresist 17 are sequentially deposited over the glass substrate 11 and the gate electrode 12.

Figure 5B:
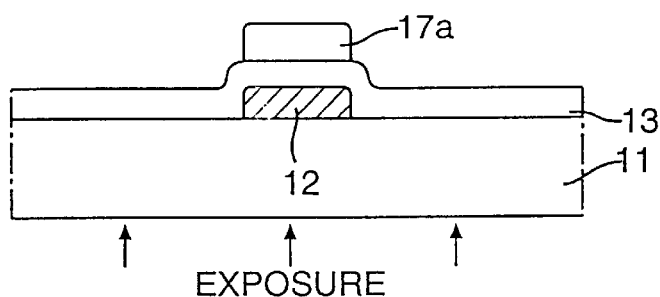

As shown in FIG. 5B, a photoresist pattern 17a is formed on the gate insulating layer 13 in a channel region by a rear surface exposing and developing process using gate electrode 12 as a mask.

Figure 5C:
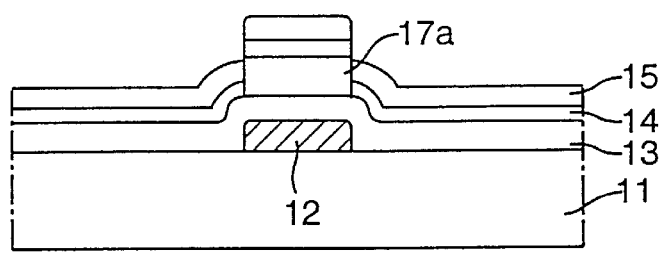

As shown in FIG. 5C, an $n^+$-amorphous silicon semiconductor ($n^+$-a-Si) layer 14 and a metal layer 15 such as Cr are sequentially deposited over the gate insulating layer 13 and the photoresist pattern 17a.

Figure 5D:
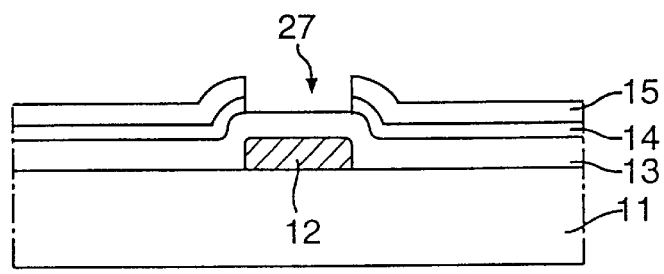

As shown in FIG. 5D, the photoresist pattern 17a, the metal layer 15 thereunder, and $n^+$-amorphous silicon semiconductor layer 14 thereunder, respectfully, are selectively removed by a lift-off process, such that only one photoresist 17a is needed to remove two layers, i.e., the metal layer 15 and the $n^+$-a-Si layer 14.

Figure 5E:
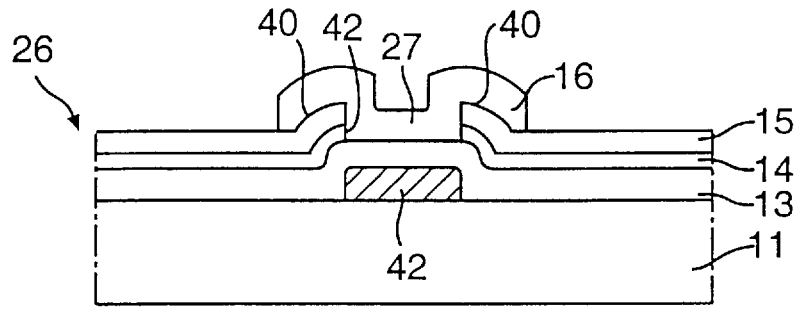

As shown in FIG. 5E, an amorphous silicon semiconductor layer 16 is deposited in a gap 27 formed by the gate insulating layer 13, the split $N^+$-amorphous silicon layer 14, and the split metal layer 15. Preferably, the a-Si layer 16 extends outside the gap 27, but only over the active region of the transistor 26, to form an active layer.

Figure 7:
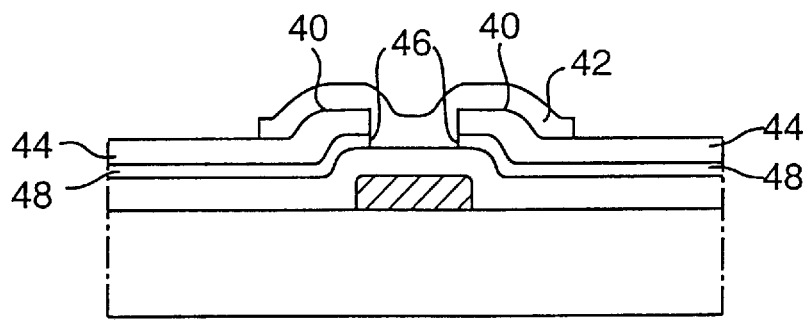
FIG. 7 is a simplified cross-section of the embodiments of the present application.

The sequence of layers shown in FIGS. 4C and 5E are depicted in greater detail in FIG. 7. As feared by the prior art, there are Schottky barriers 40 between the a-Si layer 42 and the metal layers 44. Nevertheless, this is not a problem for the embodiments of the present application because there are ohmic contact layers 46 between the a-Si layer 42 and the $n^+$-a-Si layers 48. As such, despite going against the prevailing belief in the prior art, the embodiments of the present application achieve a ±5% or better variation in the active layer thickness, roughly an at least 50% improvement over the prior art of FIGS. 1A–1G. This reduced active layer thickness variation translates to significantly reduced variation in the drain-source current, $I_{DS}$, and, e.g., fewer defective LCDS.

Figure 6:
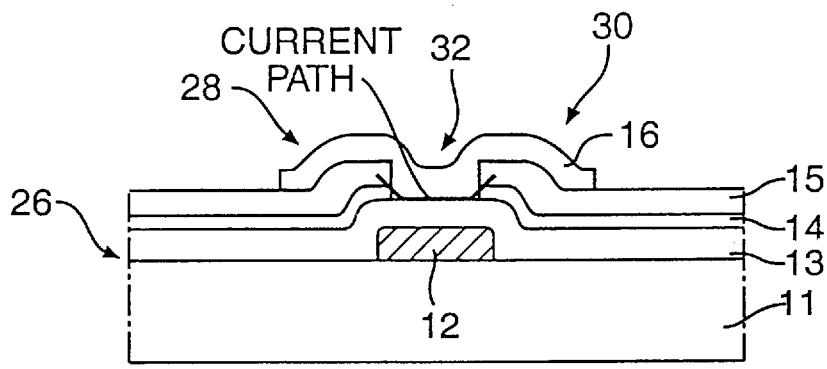
FIG. 6 shows the current path of the thin film transistor according to the present invention.

The structure of the thus-manufactured thin film transistor according to the present invention is shown in FIG. 6. In other words, a gate electrode 12 is formed on a glass substrate 11. A gate insulating layer 13 is formed over the glass substrate 11 and the gate electrode 12. An $n^+$-amorphous silicon semiconductor layer 14 and a metal layer 15 are sequentially formed and then split into a source region 28 and a drain region 30 on an upper surface of the gate insulating layer 13. Then, an amorphous silicon semiconductor layer 16 is deposited into a gap 32 formed by the gate insulating layer 13, the split $n^+$-amorphous silicon layer 14, and the split metal layer 15: The channel is formed in the part of the semiconductor layer 16 in the gap 32.

As described above, the thin film transistor according to the present invention has the following effects. First, as shown in FIG. 6, because an amorphous silicon semiconductor layer 16 is contiguously deposited over the source 28 and drain 30 electrodes and the gate insulating layer 13 of a channel region corresponding to the gap 32, the current path between the source and the drain becomes shorter and a switching speed is also improved, compared to that of a conventional thin film transistor.

Second, in etching the amorphous silicon semiconductor layer 16, the gate insulating layer 13 is used as an etch stopper or is patterned by a lift-off method adopting a self-alignment technology. Consequently, the manufacturing process becomes simplified and the patterning can be precisely performed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A thin film transistor comprising:

a substrate;

a gate electrode on said substrate;

a gate insulating layer on said substrate and said gate electrode;

a doped semiconductor layer, on the gate insulating layer, which is split thereby resulting in first and second doped semiconductor portions;

a first metal layer on the first doped semiconductor portion;

a second metal layer on the second doped semiconductor portion;

wherein a gap is formed by the first metal layer, the second metal layer, the first doped semiconductor portion, the second doped semiconductor portion, and the insulating layer; and a top semiconductor layer formed in said gap, said top semiconductor layer extending out of said gap onto said first metal layer and said second metal layer.

2. A thin film transistor as in claim 1, wherein:

a width of said gate electrode extends at least 1 micron beyond said gap.

3. A thin film transistor as in claim 1, wherein said top semiconductor layer extends beyond a region defined over said gate electrode.

4. A thin film transistor as in claim 1, wherein:

the top semiconductor layer is amorphous silicon.

5. A thin film transistor as in claim 1, wherein:

the doped semiconductor portions are amorphous silicon.

6. A thin film transistor as in claim 1, wherein:

the doped semiconductor portions are n-type semiconductor.

7. A thin film transistor as in claim 1, wherein:

the gap is formed of a first gap between the first and second doped semiconductor portions and a second gap between the first and second metal layers;

wherein the first gap is more narrow than the second gap.

8. A method of making a thin film transistor comprising:

a) providing a substrate;

b) forming a gate electrode on said substrate;

c) forming a gate insulating layer on said substrate and said gate electrode;

d) forming a doped semiconductor layer on the gate insulating layer;

e) forming a metal layer on the doped semiconductor layer;

f) removing a portion of each of the doped semiconductor layer and the metal layer to form a gap; and g) forming a top semiconductor layer in the gap and extending out of the gap onto the metal layer.

9. A method as in claim 8, wherein the step f) of removing further comprises:

f1) forming a photoresist pattern over an area of the metal that is to be removed.

10. A method as in claim 9, wherein the step f) of removing further comprises:

f2) etching both the metal layer and the doped semiconductor layer using only the photoresist pattern formed over the metal layer.

11. A method as in claim 9, wherein the step f) of removing further comprises:

using the gate electrode to form the photoresist pattern using a backside exposure technique.

12. A method as in claim 8, wherein said top semiconductor layer extends beyond a region defined over said gate electrode.

* * * * *